US006609174B1

(12) United States Patent
Naji

(10) Patent No.: US 6,609,174 B1
(45) Date of Patent: Aug. 19, 2003

(54) EMBEDDED MRAMS INCLUDING DUAL READ PORTS

(75) Inventor: Peter K. Naji, Phoenix, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/420,122

(22) Filed: Oct. 19, 1999

(51) Int. Cl.[7] ............................................. G06F 12/00
(52) U.S. Cl. ......................... 711/104; 711/131; 711/5; 711/168; 711/125; 365/171; 365/230.03; 365/230.05
(58) Field of Search ................ 711/104, 123, 711/131, 120, 149, 150, 168, 125, 126, 116, 5; 365/171, 230.03, 230.04, 230.05; 713/1, 2

(56) References Cited

U.S. PATENT DOCUMENTS

| 3,638,199 A | | 1/1972 | Kolankowsky et al. |
| 4,719,568 A | * | 1/1988 | Carrubba et al. ............ 711/123 |
| 5,832,534 A | | 11/1998 | Singh et al. |
| 5,986,925 A | * | 11/1999 | Naji et al. ................... 365/158 |
| 6,016,269 A | * | 1/2000 | Peterson et al. ............. 365/171 |
| 6,169,687 B1 | * | 1/2001 | Johnson ....................... 365/171 |
| 6,189,077 B1 | * | 2/2001 | Robertson et al. .......... 711/149 |

FOREIGN PATENT DOCUMENTS

| EP | 0936624 | 8/1999 |
| JP | 8321739 | 2/1996 |
| WO | 9641379 | 12/1996 |

* cited by examiner

Primary Examiner—Matthew Kim
Assistant Examiner—Matthew D. Anderson
(74) Attorney, Agent, or Firm—William E. Koch

(57) ABSTRACT

Processing equipment with embedded MRAMs, and a method of fabricating, including a data processing device fabricated on a semiconductor chip with MRAM cells fabricated on the chip to form one to all of the memories on the chip. Also included is a dual bank memory in communication with the data processing device and circuitry coupled to the data processing device and the dual bank memory for providing simultaneous read access to the dual bank memory.

10 Claims, 3 Drawing Sheets

EMBEDDED MRAMS INCLUDING DUAL READ PORTS

FIELD OF THE INVENTION

The present invention pertains to memories in data processing equipment.

BACKGROUND OF THE INVENTION

Many different types of data processing equipment are manufactured and used in the present day market, such as microprocessors, micro controllers, digital signal processors (DSP), or the like. All of these types of data processing equipment use a variety of memories, such as a data memory, a program or instruction memory, a boot memory, a cache memory, controlling shift registers, etc. At the present time, all of these various memories use memory devices such as DRAMs, SRAMs, flash memories, ROMs, PROMs, etc. For example, data and program memories typically use SRAMs, ROMs, or flash memories for the storage of data and operating programs. While SRAMs are very high speed, they are volatile, which means that they loose the data when power is removed and, therefore, their use is very limited. Other types of memories are generally slower and many of them require much additional circuitry, which renders them costly and relatively large.

It would be desirable, therefore, to provide data processing equipment which overcomes these drawbacks.

It is an object of the present invention to provide new and improved memories in data processing equipment.

It is another object of the present invention to provide new and improved memories in data processing equipment which is as fast as SRAMs but non-volatile.

It is still another object of the present invention to provide new and improved memories in data processing equipment with dual read ports to further enhance the speed of the equipment.

SUMMARY OF THE INVENTION

The above problems and others are at least partially solved and the above objects and others are realized in processing equipment with embedded MRAMs and a method of fabricating the equipment. The data processing equipment includes a data processing device fabricated on a semiconductor chip with MRAM cells fabricated on the chip to form one to all of the memories on the chip, including a data memory, a program or instruction memory, a boot memory, a cache memory, and controlling shift registers in communication with the data processing device.

Also, in a specific embodiment, the data processing equipment includes a dual bank memory in communication with the data processing device and circuitry coupled to the data processing device and the dual bank memory for providing simultaneous read access to the dual bank memory.

BRIEF DESCRIPTION OF THE DRAWINGS

Referring to the drawings.

DESCRIPTION OF THE PREFERRED EMBODIMENTS

Figure 1:
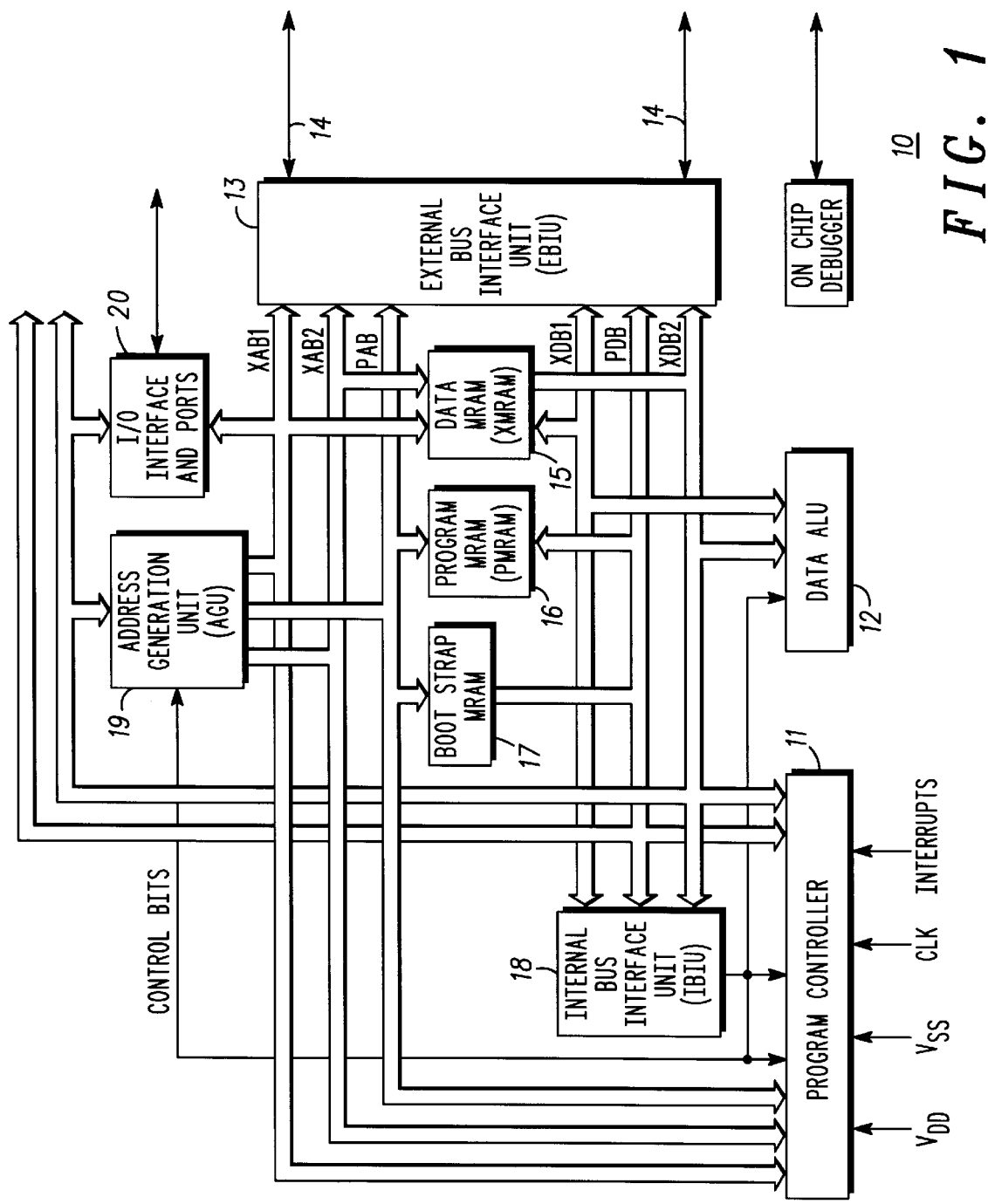
FIG. 1 is a block diagram of data processing equipment including embedded MRAMs in accordance with the present invention.

Turning now to FIG. 1, a simplified block diagram of a data processor 10 including embedded MRAM memories in accordance with the present invention. For purposes of this disclosure the term "MRAM", stands for Magnetic Random Access Memory and is defined herein as including any of the relatively recently developed thin film magnetic memory cells including magnetic tunneling junctions (MTJ), giant magnetic resonance cells (GMR), And thin magnetic film junctions separated by an electrical conductor or an electrical insulator, etc. Examples of MRAMs of each of these types are described in the patent applications set forth below, all of which are incorporated herein by reference. U.S. Pat. No. 5,702,831, entitled "Ferromagnetic GMR Material", issued Dec. 30, 1997; U.S. Pat. No. 5,732,016, entitled "Memory Cell Structure in a Magnetic Random Access Memory and a Method for Fabricating Thereof", issued Mar. 24, 1998; and U.S. Pat. No. 5,734,605, entitled "Multi-Layer Magnetic Tunneling Junction Memory Cells", issued Mar. 31, 1998.

Data processor 10 can be, for example, any of the various processing devices fabricated on a semiconductor chip, such as a microprocessor, a micro controller, a digital signal processor (DSP), or the like. Data processor 10 includes (among other things) a program controller 11, which receives various inputs, including power sources Vdd and Vss, a clock input (clk) and various "interrupts" of a working program. Data processor 10 also includes a data logic unit (ALU) 12 which utilizes the data to perform various operations, as is known in the art.

An external bus interface unit (EBIU) 13 receives data and other instructions (e.g. 'read' or 'write' instructions) from an external source by way of a bus 14 that is connected to external equipment (not shown). Interface unit 13 is connected by way of various internal buses to a data MRAM 15, a program MRAM 16 and a boostrap MRAM 17. Each of these units performs tasks well known in the art as, for example, data MRAM 15 stores data introduced by way of interface bus 13, program MRAM 16 contains programs which dictate or control the operation of data processor 10, and bootstrap MRAM 17 controls the start-up of data processor 10. Interface bus 13 is also connected to program controller 11 and an internal bus interface unit (IBIU) 18. Various other units are coupled into the buses and network to perform various tasks, such as an address generating unit (AGU) 19 and I/O (input/output) interface and ports 20.

All of the described units and interfaces are generally fabricated on a single semiconductor chip (although some minor components may be connected off chip), including the various memories described, along with additional memories in some other specific data processors. In data processor 10, all of the various memories are some type of MRAM, fabricated as described in any of the above referenced patent applications. Since all of the embedded memories (e.g. data MRAM 15, program MRAM 16, and bootstrap MRAM 17) are of the same type, the fabrication or manufacturing process is greatly simplified. Further, the speed of data processor 10 can be substantially enhanced because the speed of the MRAMs is as fast as SRAMs but non-volatile. Because SRAMs are volatile, they can not be used where permanent or semipermanent storage is required (e.g. program memories) and, thus, slower memories must be used in many of the various positions, which substantially slows the operation. Also, MRAMs make it possible such that the same processor can be used for development and for production. Otherwise, a flash based or ROM based processor is used for development and later the flash/ROM is converted to SRAM for production.

Figure 2:
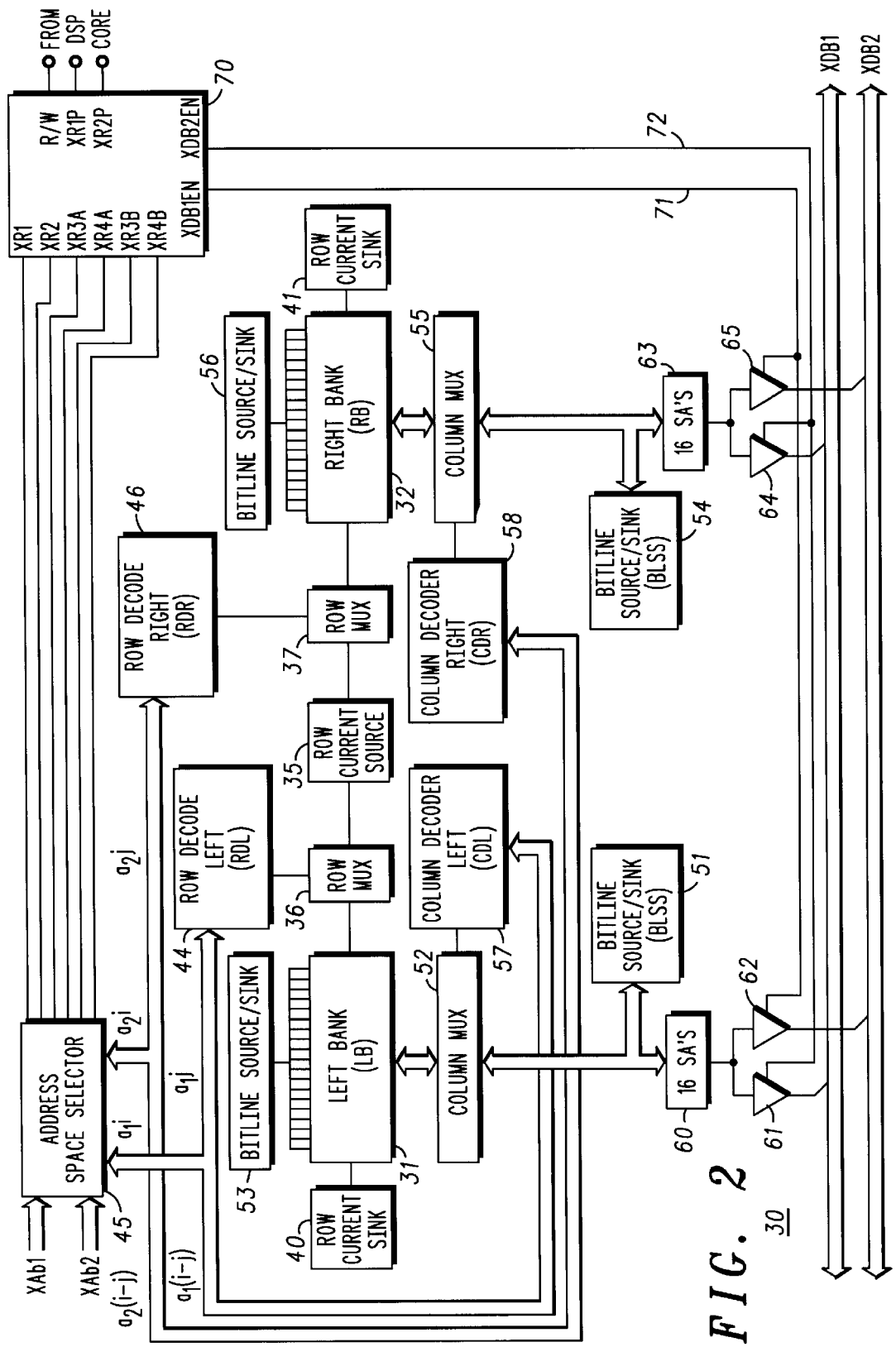
FIG. 2 is a block diagram of a dual port MRAM memory in conjunction with the present invention.

Turning now to FIG. 2, a dual port MRAM 30 is illustrated in simplified block form. MRAM 30 includes a left bank 31 (also referred to as a low address space) and a right bank 32 (also referred to as a high address space) of MRAM cells. Each of banks 31 and 32 include an array of MRAM cells with each MRAM cell being individually addressable by row and column. A row source 35 is coupled through a row multiplexer 36 to one end of the rows of MRAM cells in left bank 31 and through a row multiplexer 37 to one end of the rows of MRAM cells in right bank 32. Left bank 31 has a row sink 40 connected to the other end of the rows of MRAM cells and right bank 32 has a row sink 41 connected to the other end of the rows of MRAM cells. Row multiplexer 36 receives address inputs by way of a row decoder 44 which receives an address on parallel lines, designated $a_1j$, from an address space selector 45. Similarly, row multiplexer 37 receives address inputs by way of a row decoder 46 which receives an address on parallel lines, designated $a_2j$, from address space selector 45.

A column or bitline source/sink 51 is coupled through a column multiplexer 52 to one end (the lower end in FIG. 2) of the columns of MRAM cells in left bank 31 and the other end of the columns of cells in left bank 31 is connected to a second column or bitline source/sink 53. Similarly, a column or bitline source/sink 54 is coupled through a column multiplexer 55 to one end (the lower end in FIG. 2) of the columns of MRAM cells in right bank 32 and the other end of the columns of cells in right bank 32 is connected to a second column or bitline source/sink 56. Column multiplexer 52 receives address inputs by way of a column decoder 57 which receives an address on parallel lines, designated $a_1(i-j)$, from address space selector 45. Similarly, column multiplexer 55 receives address inputs by way of a column decoder 58 which receives an address on parallel lines, designated $a_2(i-j)$, from address space selector 45.

The data output from MRAM 30 is available at dual ports or lines, designated $XDB_1$ and $XDB_2$. Data from left bank 31 is supplied in parallel by way of column multiplexer 52 through a plurality of amplifiers 60 and to first and/or second controlled output buffers 61 and 62. Controlled output buffer 61 supplies output data to output line XDB, and controlled output buffer 62 supplies output data to output line $XDB_2$. In a similar fashion, data from right bank 32 is supplied in parallel by way of column multiplexer 55 through a plurality of amplifiers 63 and to first and/or second controlled output buffers 64 and 65. Controlled output buffer 64 supplies output data to output line $XDB_1$ and controlled output buffer 65 supplies output data to output line $XDB_2$. Controlled output buffers 61 and 64 are turned ON or activated by means of an enable signal supplied by a unit, designated 70, on a lead designated 71. Controlled output buffers 62 and 65 are turned ON or activated by means of an enable signal supplied by unit 70 on a lead designated 72.

Unit 70 is illustrated as a separate block in FIG. 2 but it can be considered for all practical purposes a portion of address space selector 45. Assuming, for sake of explanation, that MRAM 30 is incorporated in a digital signal processor (DSP), unit 70 receives two processing signals, designated $XR_1P$ and $XR_2P$, and a read/write signal from the DSP core.(not shown). Also, address space selector 45 receives two input signals, designated $XAb_1$ and $XAb_2$, and supplies signals $a_1i$ and $a_2i$ to row decoders 44 and 46 and to column decoders 57 and 58. Further, unit 70 generates six signals, designated $XR_1$, $XR_2$, $XR_3a$, $XR_3b$, $XR_4a$, and $XR_4b$, from processing signals $XR_1P$ and $XR_2P$ and a "read" signal which it supplies internally to address space selector 45. Address space selector 45 then uses the six signals from unit 70 to generate address signals $a_1i$ and $a_2i$ from input signals $XAb_1$ and $XAb_2$.

Figure 3:
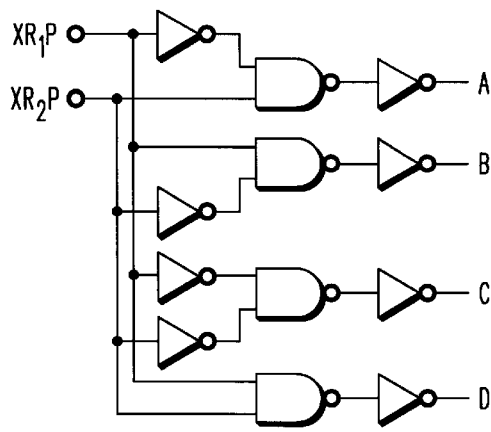
FIGS. 3, 4, and 5 are schematic diagrams of portions of a block in the diagram of FIG. 2.
Figure 4:
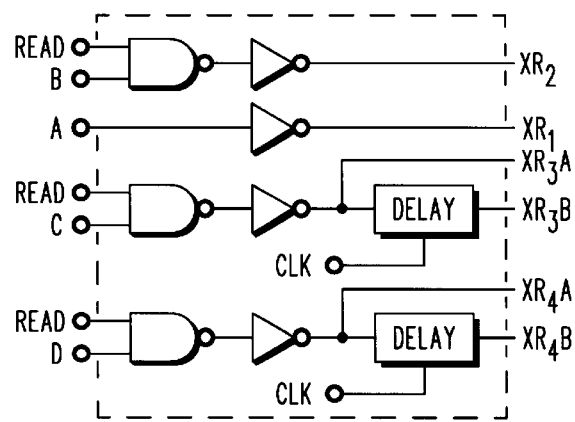
Figure 5:
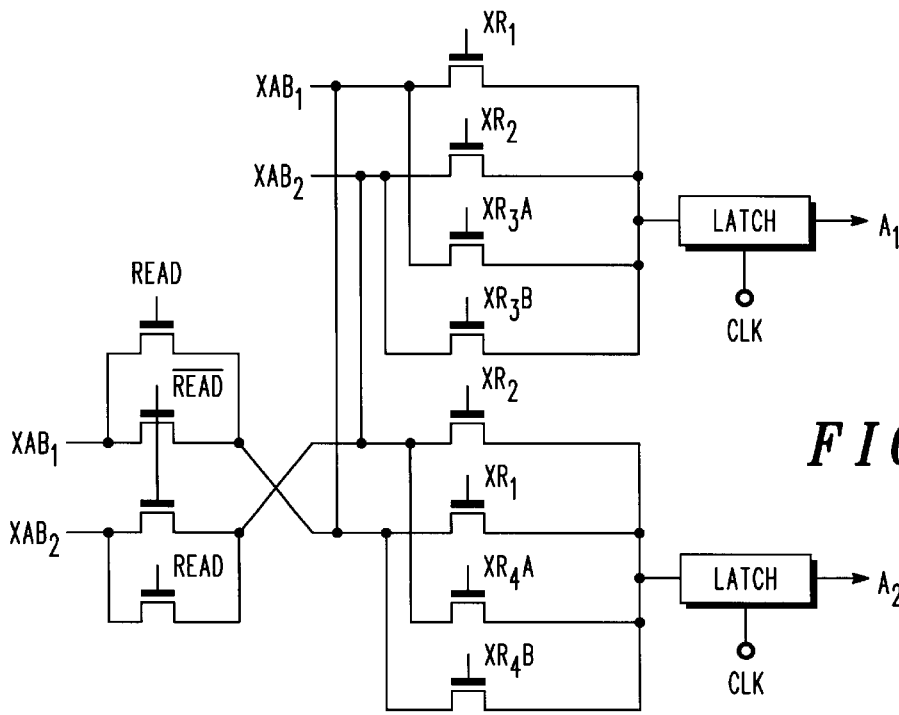

Turning now to FIG. 3, a schematic diagram of a logic circuit 75 of unit 70 is illustrated. Logic circuit 75 generates four different timing signals A, B, C, and D from input signals $XR_1P$ and $XR_2P$. Timing signals A, B, C, and D, along with a "read" signal, are used in a logic circuit 76, illustrated in FIG. 4, to generate timing signals $XR_1$, $XR_2$, $XR_3a$, $XR_3b$, $XR_4a$, and $XR_4b$, which are supplied to address space selector 45. As can be seen in the schematic diagram of FIG. 5, the six timing signals are then used to operate FET switches, which supply input signals $XAb_1$ and $XAb_2$ through latches to address lines as address signals $a_1i$ and $a_2i$.

The result of this timing are shown in the charts set forth below.

| READ TABLE | | | |
|---|---|---|---|
| $XAb_1$ | $XAb_2$ | $XR_1P$ | $XR_2P$ |
| Bank 31 | Bank 31 | 0 | 0 -> C |
| Bank 31 | Bank 32 | 1 | 0 -> A |
| Bank 32 | Bank 31 | 0 | 1 -> B |
| Bank 32 | Bank 32 | 1 | 1 -> D |

| PROGRAM TABLE | | | |
|---|---|---|---|
| $XAb_1$ | $XAb_2$ | $XR_1P$ | $XR_2P$ |
| Bank 31 | Bank 31 | 0 | 1 -> C |
| Bank 31 | Bank 32 | 0 | 1 -> A |
| Bank 32 | Bank 31 | 0 | 1 -> B |
| Bank 32 | Bank 32 | 0 | 1 -> D |

Thus, it can be seen that in the "read" mode, when the address represented by $XAb_1$ is in memory bank 31 and the address represented by $XAb_2$ is in memory bank 32, the designated address or location in memory bank 31 will be read or processed and, simultaneously, the designated address or location in memory bank 32 will be read or processed. Similarly, the opposite is true, that is when the address represented by $XAb_1$ is in memory bank 32 and the address represented by $XAb_2$ is in memory bank 31, the designated address or location in memory bank 32 will be read or processed and, simultaneously, the designated address or location in memory bank 31 will be read or processed. When both $XAb_1$ and $XAb_2$ represent addresses in memory bank 31 or memory bank 32, which implies that both address inputs are accessing the same memory bank. Since two addresses in a single memory core cannot be processed simultaneously, the DSP core automatically inserts a wait state and performs the $XAb_1$ read first and the $XAb_2$ read second. Inside XMRAM when both accesses are in bank 31 C goes active high and subsequently $XR_3a$ and $XR_3b$ go active high, where $XR_3b$ is delayed by one instruction cycle with respect to $XR_3a$. This allows $XAb_1$ access to be read first and $XAb_2$ access second. A similar process takes place when both accesses are in bank 32. Programming, on the other hand, is performed only on one memory bank at a time. However, since time in a programming sequence is not as critical, the fact that a normal time is used in programming has no effect on the user.

Thus, a great speed advantage can be realized at least in DSPs, microcontrollers, or microprocessors in the ability to access, for example, instructions and data simultaneously. Further, new and improved memories in data processing equipment are disclosed which are as fast as SRAMs but non-volatile and which can be embedded in a semiconductor chip to form any of the memories associated with data processing equipment.

While I have shown and described specific embodiments of the present invention, further modifications and improvements will occur to those skilled in the art. I desire it to be understood, therefore, that this invention is not limited to the particular forms shown and I intend in the appended claims to cover all modifications that do not depart from the spirit and scope of this invention.

What is claimed is:

1. Processing equipment with embedded MRAMs comprising:

an instruction memory;

a boot memory;

a cache memory;

a plurality of shift registers;

a data processing device in communication with the instruction memory, boot memory, cache memory, and plurality of shift registers, all of which are fabricated on a semiconductor chip; and MRAM cells fabricated on the semiconductor chip as a data memory in communication with the data processing device, the data memory including circuitry providing a dual port read function to provide simultaneous data outputs to the data processing device.

2. Processing equipment with embedded MRAMs as claimed in claim 1 wherein the MRAM cells are thin film magnetic memory cells including one of magnetic tunneling junctions (MTJ), giant magnetic resonance cells (GMR), and magnetic film junctions separated by an electrical conductor or an electrical insulator.

3. Processing equipment with embedded MRAMs comprising;

a data processing device fabricated on a semiconductor chip;

MRAM cells fabricated on the semiconductor chip to form a dual bank memory in communication with the data processing device; and circuitry coupled to the data processing device and the dual bank memory for providing simultaneous read access to the dual bank memory.

4. Processing equipment with embedded MRAMs as claimed in claim 3 wherein the dual bank memory includes an addressable first memory bank with an output port and an addressable second memory bank with an output port and the circuitry includes first and second address inputs and logic for simultaneously routing first and second addresses on the first and second address inputs to the first and second addressable memory banks, respectively.

5. A method of fabricating data processing equipment comprising the steps of:

fabricating a program or instruction memory;

fabricating a boot memory;

fabricating a cache memory;

fabricating a plurality of shift registers;

fabricating a data processing device on a semiconductor chip, in communication with the program or instruction memory, boot memory, cache memory, and plurality of shift registers, all of which are fabricated on a semiconductor chip; and fabricating MRAM cells un the semiconductor chip as a data memory in communication with the data processing device, the data memory including circuitry providing a dual port read function to provide simultaneous data outputs to the data processing device.

6. A method of fabricating data processing equipment as claimed in claim 5 wherein the step of fabricating MRAM cells on the chip includes fabricating an addressable dual bank data memory on the chip.

7. A method of fabricating data processing equipment as claimed in claim 6 wherein the step of fabricating an addressable dual bank data memory on the chip includes fabricating logic on the chip including first and second address inputs and logic for simultaneously routing first and second addresses on the first and second address inputs to the first and second addressable memory banks, respectively.

8. A method of fabricating data processing equipment as claimed in claim 6 wherein all memories on the chip are fabricated from MRAM cells.

9. Processing equipment with embedded MRAMs comprising a data memory a boot memory;

a cache memory;

a plurality of shift registers;

a data processing device in communication with the data memory, boot memory, cache memory, and plurality of shift registers, all of which are fabricated on a semiconductor chip; and MRAM cells fabricated on the semiconductor chip as an instruction memory in communication with the data processing device, the instruction memory including circuitry providing a dual port read function to provide simultaneous data outputs to the data processing device.

10. Processing equipment with embedded MRAMs as claimed in claim 9 wherein the MRAM cells are thin film magnetic memory cells including one of magnetic tunneling junctions (MTJ), giant magnetic resonance cells (GMR), and magnetic film junctions separated by an electrical conductor or an electrical insulator.

* * * * *